(12) United States Patent
Chong et al.

(10) Patent No.: US 7,939,413 B2
(45) Date of Patent: May 10, 2011

(54) EMBEDDED STRESSOR STRUCTURE AND PROCESS

(75) Inventors: Yung Fu Chong, Singapore (SG); Zhijiong Luo, Carmel, NY (US); Joo Chan Kim, Fishkill, NY (US); Brian Joseph Greene, Yorktown Heights, NY (US); Kern Rim, Yorktown Heights, NY (US)

(73) Assignees: Samsung Electronics Co., Ltd. (KR); Chartered Semiconductor Manufacturing, Ltd., Singapore (SG); International Business Machines Corp (IBM)

( * ) Notice: Subject to any disclaimer, the term of this patent is extended or adjusted under 35 U.S.C. 154(b) by 924 days.

(21) Appl. No.: 11/297,522

(22) Filed: Dec. 8, 2005

(65) Prior Publication Data

US 2007/0132038 A1     Jun. 14, 2007

(51) Int. Cl.
*H01L 21/336* (2006.01)
(52) U.S. Cl. ........ 438/300; 438/197; 438/222; 438/226; 257/E21.431
(58) Field of Classification Search ............... 257/374, 257/19; 438/230, 226, 300
See application file for complete search history.

(56) References Cited

U.S. PATENT DOCUMENTS

| | | | |
|---|---|---|---|
| 6,531,347 B1 | 3/2003 | Huster | |
| 6,861,318 B2 | 3/2005 | Murthy | |
| 6,902,971 B2 | 6/2005 | Grudowski | |
| 7,190,036 B2 * | 3/2007 | Ko et al. | 257/374 |
| 2004/0142545 A1 | 7/2004 | Ngo | |
| 2005/0079692 A1 | 4/2005 | Samoilov | |
| 2005/0104057 A1 | 5/2005 | Shaheed | |
| 2005/0112817 A1 * | 5/2005 | Cheng et al. | 438/219 |
| 2005/0136606 A1 | 6/2005 | Rulke | |
| 2005/0253200 A1 * | 11/2005 | Murthy et al. | 257/382 |

FOREIGN PATENT DOCUMENTS

JP    2005-317767    11/2005
KR    1020060076150 A    7/2006

* cited by examiner

*Primary Examiner* — Kenneth A Parker
*Assistant Examiner* — Jose R Diaz
(74) *Attorney, Agent, or Firm* — Horizon IP Pte Ltd (57) ABSTRACT

An example embodiments are structures and methods for forming an FET with embedded stressor S/D regions (e.g., SiGe), a doped layer below the embedded S/D region adjacent to the isolation regions, and a stressor liner over reduced spacers of the FET gate. An example method comprising the following. We provide a gate structure over a first region in a substrate. The gate structure is comprised of gate dielectric, a gate, and sidewall spacers. We provide isolation regions in the first region spaced from the gate structure; and a channel region in the substrate under the gate structure. We form S/D recesses in the first region in the substrate adjacent to the sidewall spacers. We form S/D stressor regions filling the S/D recesses. The S/D stressor regions can be thicker adjacent to the gate structure than adjacent to the isolation regions; We implant dopant ions into the S/D stressor regions and into the substrate below the S/D stressor regions adjacent to the isolation regions to form upper stressor doped regions.

27 Claims, 6 Drawing Sheets

EMBEDDED STRESSOR STRUCTURE AND PROCESS

BACKGROUND OF INVENTION

1) Field of the Invention

This invention relates generally to devices and methods for the fabrication of semiconductor devices and more particularly to the fabrication of FET's having embedded Source/Drain regions.

2) Description of the Prior Art

It is now well-known that SiGe can be embedded into the S/D regions of PFETs to generate uniaxial stress in the silicon channel. This in turn increases the carrier mobility and thus enhances the PFET device performance significantly. However, the integration of embedded SiGe (eSiGe) into the normal CMOS process flow is extremely challenging. The extent of performance enhancement also depends strongly on the stress generated by the SiGe itself, the active dopant concentration in the eSiGe and the compatibility to stress liners overlying the transistor structures.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 6,861,318: Semiconductor transistor having a stressed channel—Semiconductor transistor for integrated circuits, comprises source and drain formed in source and drain recesses, respectively, source and/or drain being made of film material, which is formed to have second lattice having second spacing Inventor: Murthy, Anand;

U.S. Pat. No. 6,531,347: Method of making recessed source drains to reduce fringing capacitance—Manufacture of semiconductor device involves forming source and drain regions that are recessed at prescribed depth below semiconductor substrate surface Inventor: Huster, Carl US20050079692A1: Methods to fabricate MOSFET devices using selective deposition process—Fabrication of silicon-based device on substrate surface involves depositing first and second silicon-containing layers by exposing to specified first and second process gases, respectively Inventor: Samoilov, Arkadii V.; Sunn US20050104057A1: Methods of manufacturing a stressed MOS transistor structure—Manufacture of stressed metal oxide semiconductor transistor structure comprises creating intentionally recessed region in region of semiconductor material, and creating layer on surface of recessed region to induce tensile stress—Inventor: Shaheed, M. Reaz;

US20050136606A1: Spacer for a gate electrode having tensile stress and a method of forming the same—Inventor: Rulke, Hartmut By reducing a deposition rate and maintaining a low bias power in a plasma atmosphere, a spacer layer, for example a silicon nitride layer, may be deposited that exhibits tensile stress. The amount of tensile stress is controllable within a wide range, thereby providing the potential for forming sidewall spacer elements that modify the charge carrier mobility and thus the conductivity of the channel region of a field effect transistor.

U.S. Pat. No. 6,902,971: Transistor sidewall spacer stress modulation—Fabrication of semiconductor, e.g. metal oxide semiconductor transistor, by forming gate electrode on gate dielectric, thermally depositing silicon nitride spacer film, modulating stress characteristic of spacer film, and etching film—Inventor: Grudowski, Paul A.; Austin, Tex., United States of America US20040142545A1: Semiconductor with tensile strained substrate and method of making the same—Formation of metal oxide semiconductor field effect transistor involves high compression deposition that increases tensile strain in silicon layer—Inventor: Ngo, Minh V.;—shows nitride stress layer over gate.

SUMMARY OF THE INVENTION

The embodiments of the present invention provide a structure and a method of manufacturing Field Effect Transistors (FETs) having a strained channel which is characterized as follows.

Example embodiments are structures and methods for forming an FET with Embedded Stressor S/D regions (e.g., SiGe), a doped layer below the embedded S/D region adjacent to the isolation regions, and a stressor liner over reduced spacers of the FET gate.

An example method comprises the following. We provide a gate structure over a first region in a substrate. The gate structure is comprised of gate dielectric, a gate, and sidewall spacers. We provide isolation regions in the first region spaced from the gate structure and a channel region in the substrate under the gate structure. We form S/D recesses in the first region in the substrate adjacent to the sidewall spacers. We form S/D stressor regions filling the S/D recesses. The S/D stressor regions can be thicker adjacent to the gate structure than adjacent to the isolation regions. We implant dopant ions into the S/D stressor regions and into the substrate below the S/D stressor regions adjacent to the isolation regions to form upper stressor doped regions.

The claims and specification describe additional example embodiments.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

The example embodiments of the present invention will be described in detail with reference to the accompanying drawings. The example embodiments provide a method of forming a FET with Embedded Stressor S/D regions, that can comprise one or more of the following features: a upper stressor doped region that extends below the embedded S/D region, reduced width spacers on the FET gate structures and a stressor liner over the spacers of the FET gate.

A. NFET Gate Structure and PFET Gate Structure

Figure 1:
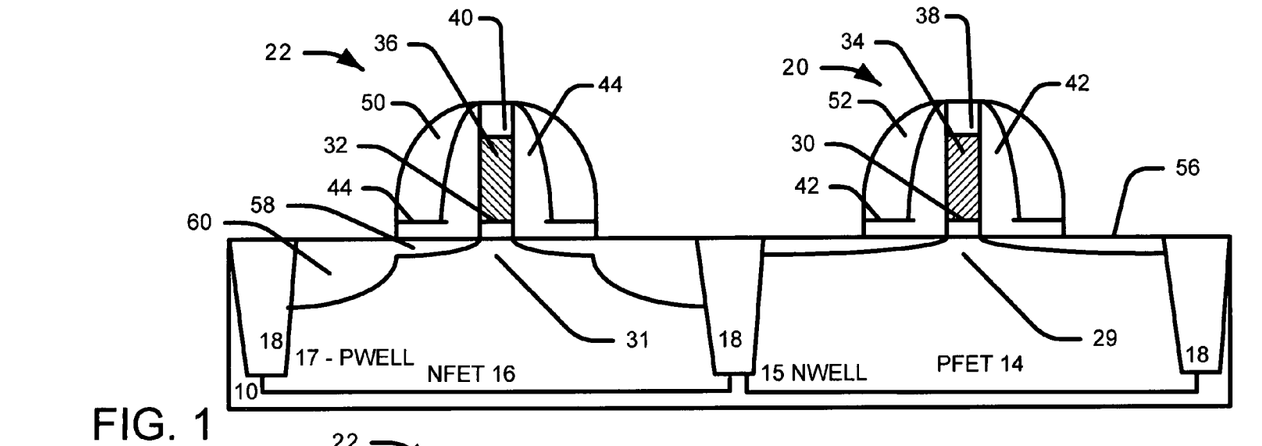
FIGS. 1 through 9 are cross sectional views for illustrating a method for manufacturing Field Effect Transistors (FETs) having a strained channel according to an example embodiment of the present invention.

Referring to FIG. 1, we provide a NFET gate structure 22 over a NFET region 16 in a substrate 10 and PFET gate structure 20 over a PFET region 14 in a substrate 10.

The NFET gate structure 22 can be comprised of a NFET gate dielectric 32, NFET Channel region 31, a NFET gate 36, NFET gate capping layer 40, and sidewall spacers. The spacers can be comprised of one or more layers. For example, the sidewall spacers can be comprised of NFET first (e.g., L shaped) spacers 44, and NFET second spacers 50.

An example of a NFET gate structure 22 is given below.

The NFET gate dielectric 32 can be comprised of $SiO_XN_Y$, nitrided $SiO_2$ (either by plasma or thermal means, or a combination thereof), $HfO_2$, $HfSi_XO_Y$, $HfAl_XO_Y$ and can have a thickness between 8 and 50 angstroms. The NFET gate 36 can be comprised of poly-Si or poly-SiGe or metals such as Ta, TaN, TaSiN, TiN, Mo, Ru, Ni, NiSi or a combination thereof and can have a thickness between 500 and 1200 angstroms The NFET gate capping layer 40 can be comprised of nitride or $SiO_XN_Y$ or $SiO_2$ and can have thickness between 200 and 600 angstroms The NFET first L shaped spacers 44 can be comprised of thermal oxide or TEOS and can have thickness between 20 and 200 angstroms The NFET second spacers 50 can be comprised of nitride or oxide and can have a thickness between 200 and 700 angstroms.

The substrate can have a p-well 17 in the NFET region.

The PFET gate structure 20 can be comprised of a PFET gate dielectric 30, a PFET gate 34, PFET gate capping layer 38, and sidewall spacers. The spacers can be comprised of one or more layers. For example, the sidewall spacers can be comprised of PFET first (L shaped) spacers 42, and PFET second spacers 52. A PFET channel region 29 is in the substrate below the PFET gate.

The PFET gate structure can have the same corresponding composition and thickness as describe above for the NFET gate structure.

We provide NFET Source/drain 60 and NFET Source/drain extension (SDE) or lightly doped drain (LDD) regions 58 adjacent to the NFET gate 36.

We provide PFET LDD regions (or SDE regions) 56 adjacent to the PFET gate 34. It is optional to perform a PFET source/drain or P-type graded or buffer implant at this point.

The substrate can have a n-well 15 in the PFET region.

We provide isolation regions 18 between the PFET region 14 and the NFET region 16. The isolation regions 18 are preferably shallow trench isolation regions comprised of silicon oxide. The isolation region 18 preferably have a thickness between 1000 and 7000 angstroms.

B. Dielectric Layer Over the Substrate

Figure 2:
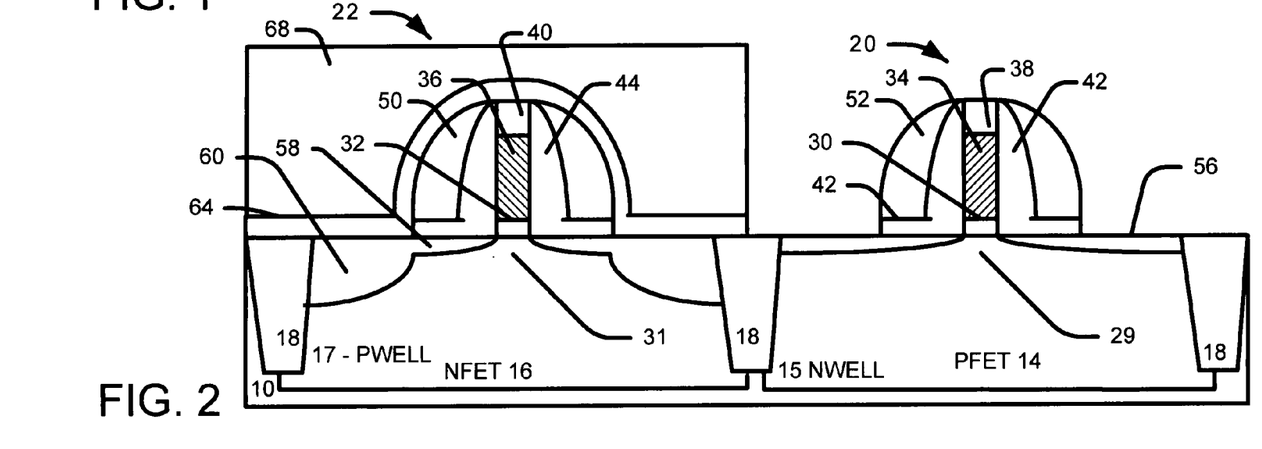

Referring to FIG. 2, we form a dielectric layer 64 over the substrate, including the gate structures 22 20. The dielectric layer 64 is preferably comprised of an oxide formed by a low temperature process (LTO), for example at a temperate between 300 and 500 degrees C. A reason the LTO oxide is preferred is that it can be easily removed in the later part of the process. Also, low temperature is preferred because the thermal budget will have negligible impact on the device architecture. The dielectric layer 64 preferably has a thickness between 100 and 600 angstroms.

C. Remove the Dielectric Layer from Over the PFET Region

We next form a first NFET mask 68 over the dielectric layer 64 in the NFET region 16 and over portions of the isolation regions 18. The mask is preferably comprised of photoresist.

We remove the dielectric layer 64 from over the PFET region using an etch process such as a buffered HF etch.

Figure 3:
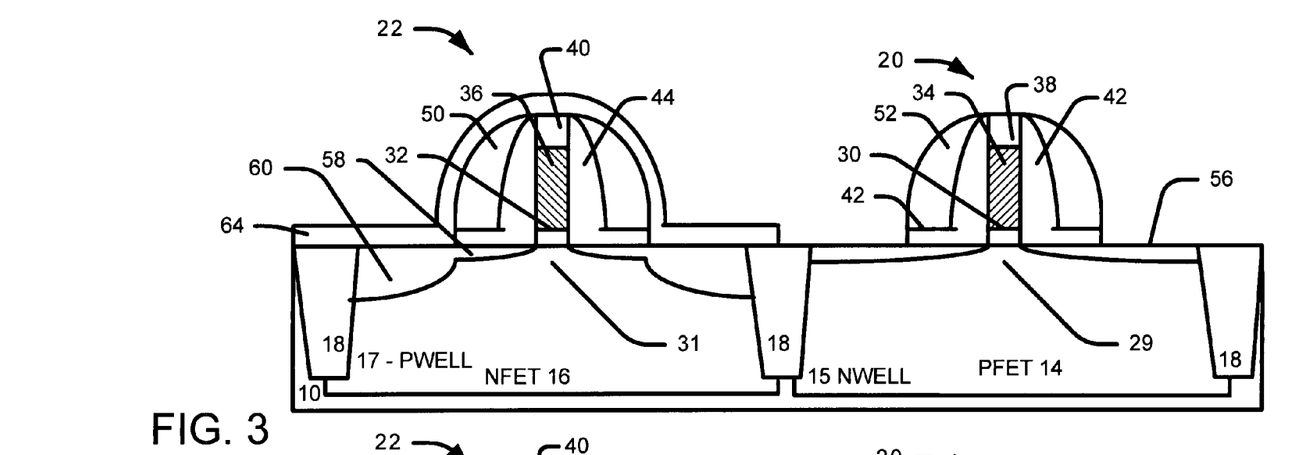

As shown in FIG. 3, we remove the first NFET mask 68.

D. Form Recesses in the PFET Region

Figure 4:
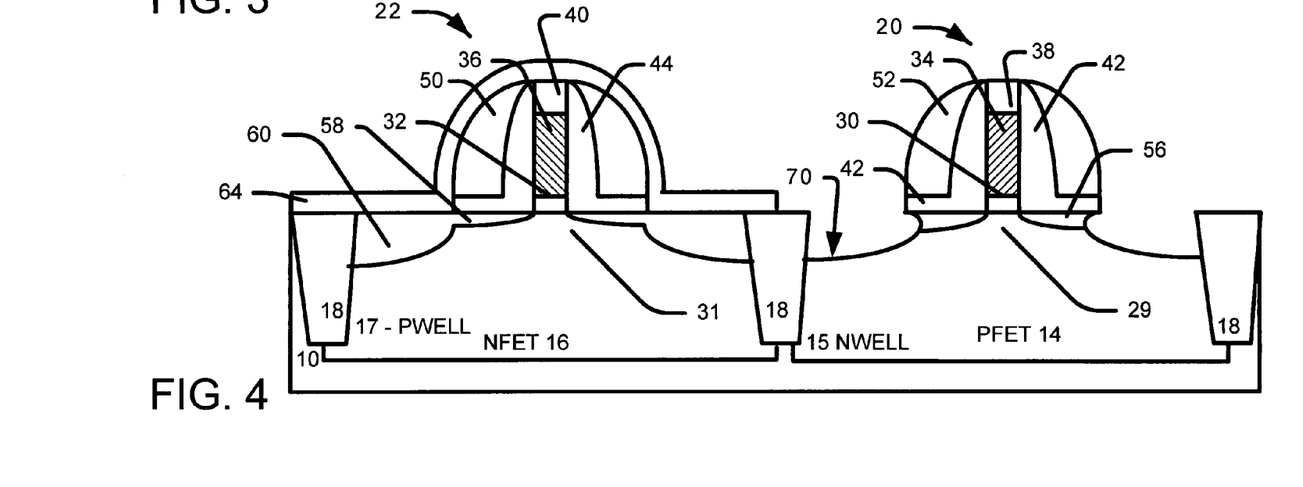

Referring to FIG. 4, we can form recesses 70 in the PFET region 14 in the substrate adjacent to the PFET second spacers using isotropic or anisotropic dry etch, or a combination thereof, preferably using isotropic dry etch. The isotropic dry etch not only etches in the vertical direction, but also etches in the horizontal direction, and some undercutting beneath the spacers 52 is desired.

The recesses 70 can have a depth between 40 and 160 nm.

E. Form an Embedded Stressor SID Region

Figure 5A:
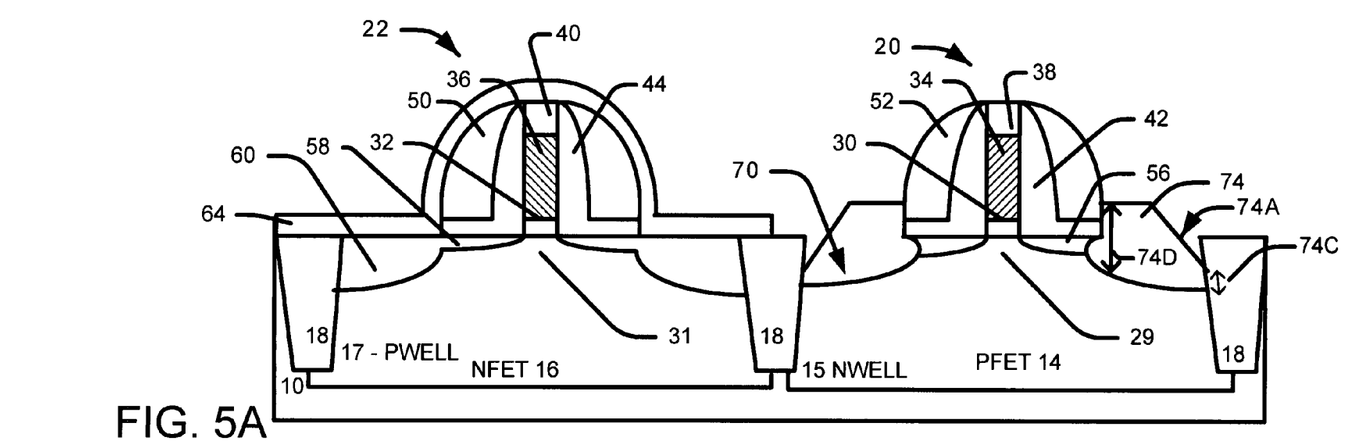

Referring to FIG. 5A, preferably we perform an epitaxy pre-clean to prepare the substrate surface for the subsequent epitaxy process. The epitaxy pre-clean preferably contains HF, either in the gaseous or liquid state, or a combination of other chemicals and steps that include the gaseous HF or liquid HF.

Referring to FIG. 5A, we form embedded stressor (e.g., B doped SiGe) Source/drain regions 74 using an in-situ Boron doped SiGe Epitaxy process or an implant process. Selective epitaxial growth occurs only for the exposed Si in the PFET regions 14, but not on the gate structure 20. Also, the dielectric layer 64 over the NFET region 16 protects the NFET region 16 from epitaxial growth.

The embedded stressor source/drain regions 74 are formed to create a compressive stress in the channel of the PFET. The Ge content of the SiGe can be in the range of 10 to 40 atomic percent. The embedded stressor region 74 can have a p-type impurity concentration between 5E19 and 1E21 atoms/cm$^3$.

The embedded stressor S/D regions 74 (e.g., a SiGe layer) can be in-situ (boron) doped or implanted with a dopant after formation. For example, we can form an intrinsic SiGe film, followed by ion implantation (B or $BF_2$). The ion implantation dose is in the range of 1E15/cm$^2$ and 6E15/cm$^2$, with implantation energies of between 0.6 keV and 50 keV.

The embedded stressor S/D regions 74 can have a faceted edge 74A (or a recess 74A) between the spacer 52 and the isolation 18. The facet starts about midway between the spacer 52 and the STI 18 as shown in FIG. 5A. The SiGe S/D regions 74 are thinner near the STI 18 because there is no silicon to grow epitaxy from at the STI region. Hence, epitaxial SiGe growth is primarily in the vertical direction and limited growth occurs from the lateral direction.

The growth of SiGe against the STI sidewall can be faceted (or reduced) because there is no silicon to grow from at the STI region. Hence, growth is primarily in the vertical direction and limited growth occurs from the lateral direction.

The S/D stressor 74 adjacent the spacer 52 can have a thickness 74D between 40 and 180 nm and more preferably between 60 and 140 nm. The SiGe adjacent the STI 18 can have a thickness 74C between 1 and 80 nm and more preferably between 5 and 40 nm. The ratio of the thickness 74D to thickness 74C is between 5:1 and 20:1.

For a PFET device, the S/D stressor region is preferably comprised of a semiconductor material whereby after incorporation into the host atoms (in this case, it is the substrate, which is essentially Si), the material system becomes internally compressed. Due to the lattice mismatch between the stressor and the substrate, a compressive strain is created in the direction parallel to the channel.

The substrate is comprised of a semiconductor material (e.g., Si) having a first lattice with a first structure and a first spacing. The stressor region is comprised of a semiconductor material (e.g, SiGe or SiC) having a second lattice with the same first structure and a second spacing.

For a PFET device, the second spacing is larger than the first spacing. For a NFET device with n-type doping, the second spacing is smaller than the first spacing.

F. Remove the First Dielectric Layer Over the NFET Region and Form Isolation Recesses in Portions the Isolation Regions Referring to FIG. 5B, we perform an dielectric (e.g., oxide) etch to remove the first dielectric layer 64 over the NFET region 16 and to form isolation recesses 76 in the isolation regions in the areas not formally covered by the first dielectric layer 64. The recessed STI helps to increase the strain on the PFET channel from the subsequently formed stress layer.

Figure 5B:
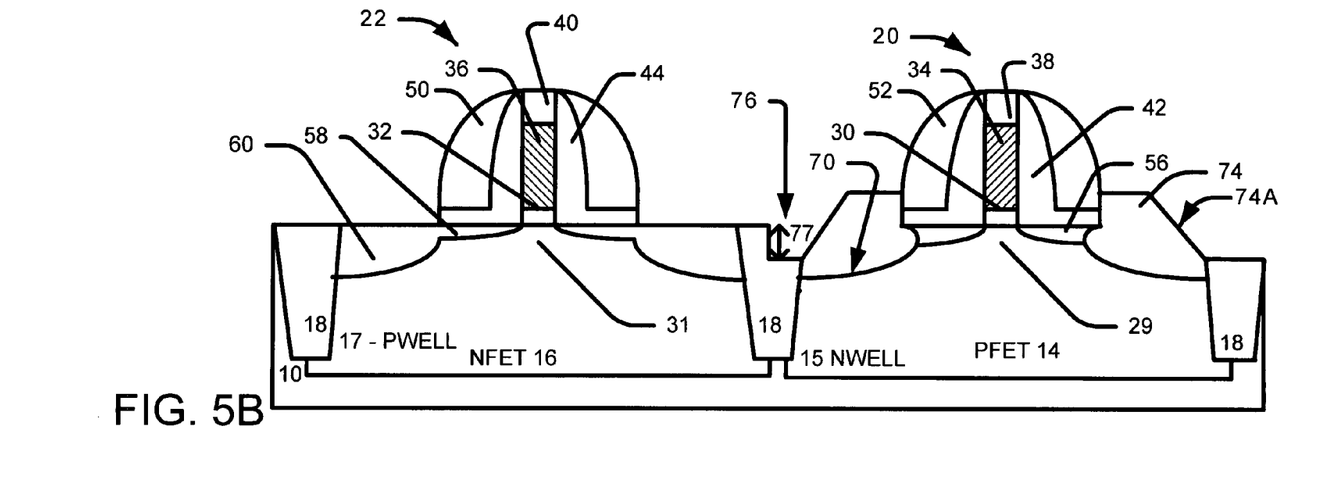

The recesses 76 can have a depth 77 between 5 and 80 nm.

G. Remove the PFET Cap and NFET Cap; and Reduce Overall Sidewall Spacers Width

Figure 6:
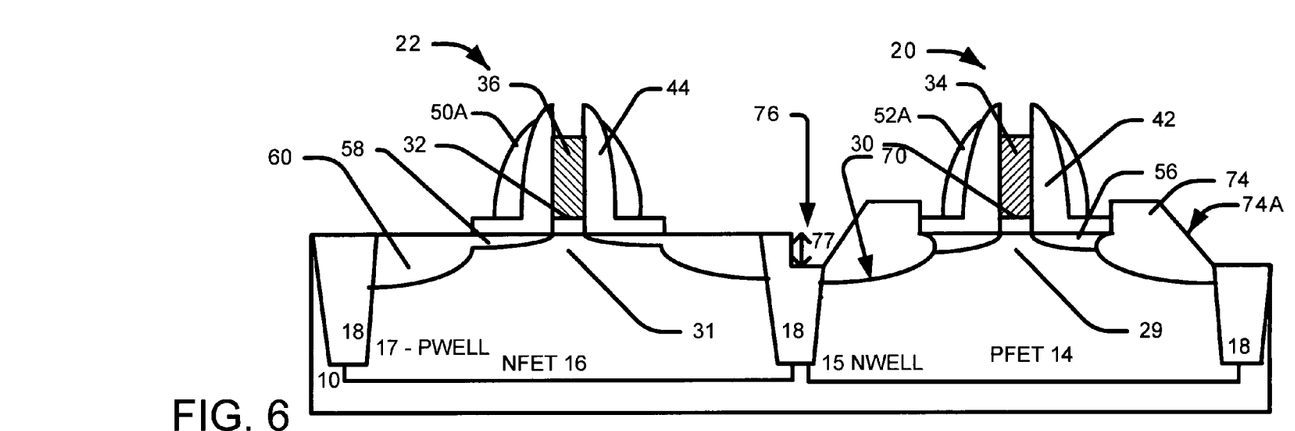

As shown in FIG. 6, we can etch and remove the PFET gate capping layer 38 and NFET gate capping layer 40 and etch the second PFET spacers 52 and the second NFET spacer 50 to form reduced second PFET spacers 52A and reduced second NFET spacers 50A.

The reduced second PFET and NFET spacers 52A 50A can have width between 20 and 300 angstroms.

The step can reduce the total spacer (50A & 44, 52A & 42) width between 5 and 80 percent and more preferably between 20 and 60 percent compared to the original total width (e.g., 50 & 44, 52 & 42)

The reduced width spacers increase the strain on the channel from the subsequently formed stress layer.

The etch is preferably an anisotropic RIE with a high selectivity of nitride to silicon and high selectivity of nitride to oxide. The etch can be comprised of $O_2$, Ar, $CHF_3$, $CH_3F$, $C_4F_8$ or a combination thereof. The etch can also have an "isotropic" component to further trim down the spacer width.

The first spacer 42 is an L-shaped spacer comprised of a bottom leg and a vertical spacer. The reduced second spacer 52A is on the first spacer 42. The bottom leg is preferably longer than the width of the second spacer 52A by between 5 and 60%.

H. Form Upper Stressor Doped Regions

Figure 7:
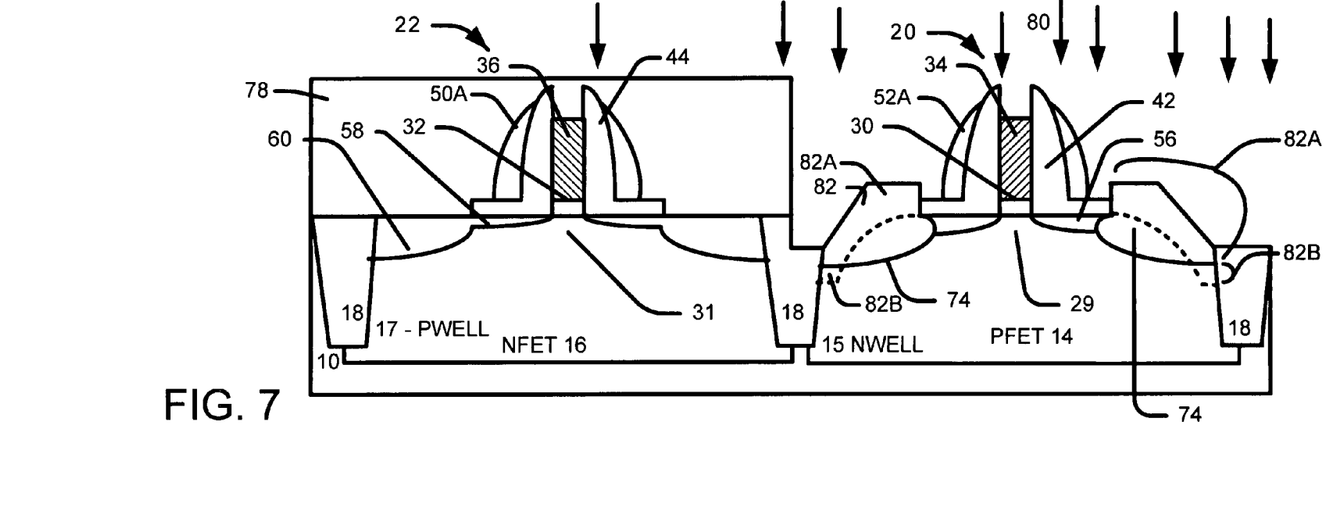

As shown in FIG. 7 we form a second NFET mask 78 over the NFET region 16.

Next we implant P-type dopant ions (boron) 80 into the (PFET) embedded B doped SiGe Source/drains 74 and into the substrate below the embedded B doped SiGe Source/drains 74 adjacent to the isolation regions 18 to form upper stressor P-type doped regions (or Stressor "wrap around" doped region) 82.

It is optional to perform this B ion implantation before the removal of PFET cap and 38 and NFET cap 40

The ion implantation dose can be in the range of $5E13/cm^2$ and $4E15/cm^2$, with implantation energies of between 0.3 keV and 20 keV. The implant can have a twist/tilt component, but preferably none, i.e. the implant is done perpendicularly to the Si substrate 10.

The upper stressor P-type doped regions 82 have a dopant concentration preferably between 0.2 and 5 times higher than the stressor region 74.

Preferably the (B regions) upper stressor P-type doped regions 82 have a first portion 82A within the stressor region 74 and a second portion 82B that extend below the embedded S/D region 74 in to the substrate 10. This is because the embedded S/D regions 74 are thinner near the isolation regions 18.

The additional boron implant 80 forms an upper stressor "wrap around" P-type doped region 82. The upper stressor P-type doped region 82 is comprised of a first portion 82A surrounding the stressor 74 and a second portion 82B extending into the substrate. The first portion of the upper stressor doped region 82A greatly reduces the external resistance of the PFET device. Also, it reduces the contact resistance of the subsequent silicided regions.

On the other hand, the second portion 82B of the extended B region extends into the substrate and reinforces the B dopants that are in contact with the N-well near the STI edge. The enhanced concentration of B dopants at the graded junction near the STI edge reduces the leakage of P+ to N-well and P+ to P-well (in the adjacent NFET). Hence, region 82B greatly improves the isolation properties of the PFET.

This additional B ion implantation 80 also gets implanted into the PFET poly-Si gate and hence it increases the dopant concentration at the poly-Si gate. This can reduce the poly-depletion effect at the gate/gate dielectric interface and also reduces the gate resistance significantly.

Figure 8:
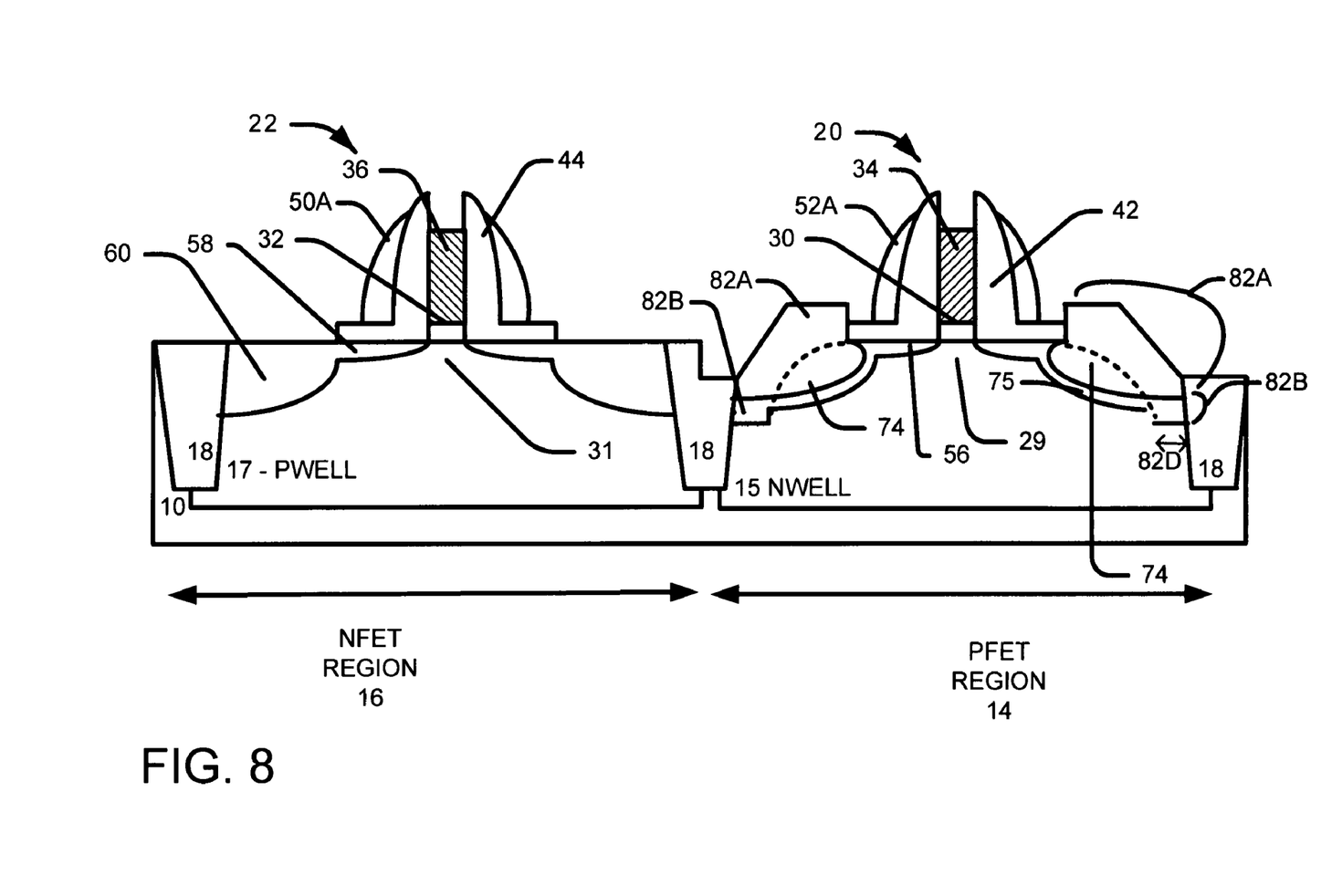

As shown in FIG. 8, we remove the second NFET mask 78.

I. Performing an Anneal to Form Final Junctions for Both NFET and PFET

We preferably perform an anneal to form final S/D junctions for both NFET and PFET. The P-type dopants from the embedded S/D 74 diffuse into the substrate to form a final P S/D region 75. After the anneal, the second portion 82B of the B region 82 that extends below the embedded S/D region 74 diffuses slightly into the substrate. (graded junction near the STI edge 82B)

The anneal is preferably a RTA process with a temperature between 900 and 1350 C. for a duration between 500 microsec and 5 sec. Typically, a spike RTA anneal is performed for less than 1 sec.

The additional B implant helps to tailor the portion 82B of the B region 82 junction provided below the SiGe embedded S/D region 74 near the STI edge 18, thus improving isolation properties by reducing P+ to N-well and P+ to P-well (in the adjacent NFET) leakages.

The second portion 82B of the extended B region 82 preferably has B concentration between $5E16/cm^3$ and $1E20/cm^3$ and portion 82B has a depth below the S/D stressor 74 between 1 nm and 20 nm. The second portion 82B can have a width (distance) 82D between 1 and 20 nm. The second portion 82B has a distance 82D that can be between 5 and 60 percent and more preferably between 10 and 40 percent of the average thickness of the stressor region 74.

The upper stressor "wrap around" P-type -doped region 82 preferably has a final depth below the top surface of the Stressor 74 between 5% and 50% of the thickness of the stressor layer 74. Table: Example Final Concentrations for PFET Devices

TABLE

Example final concentrations for PFET devices

| layer | low concentration atoms/cm$^3$ | high concentration atoms/cm$^3$ | preferred low concentration atoms/cm$^3$ | preferred high concentration atoms/cm$^3$ |
|---|---|---|---|---|
| first portion 82A | 6E19 | 2E21 | 1E20 | 5E20 |
| 82B - second portion below Stressor 74 | 5E16 | 1E20 | 5E17 | 7E19 |
| stress region 74 (not including 82B) | 5E19 | 1E21 | 9E19 | 3E20 |
| final P S/D region 75 (part that diffused into the substrate) | 5E17 | 2E20 | 1E18 | 1E20 |

J. Suicide Regions

Figure 9:
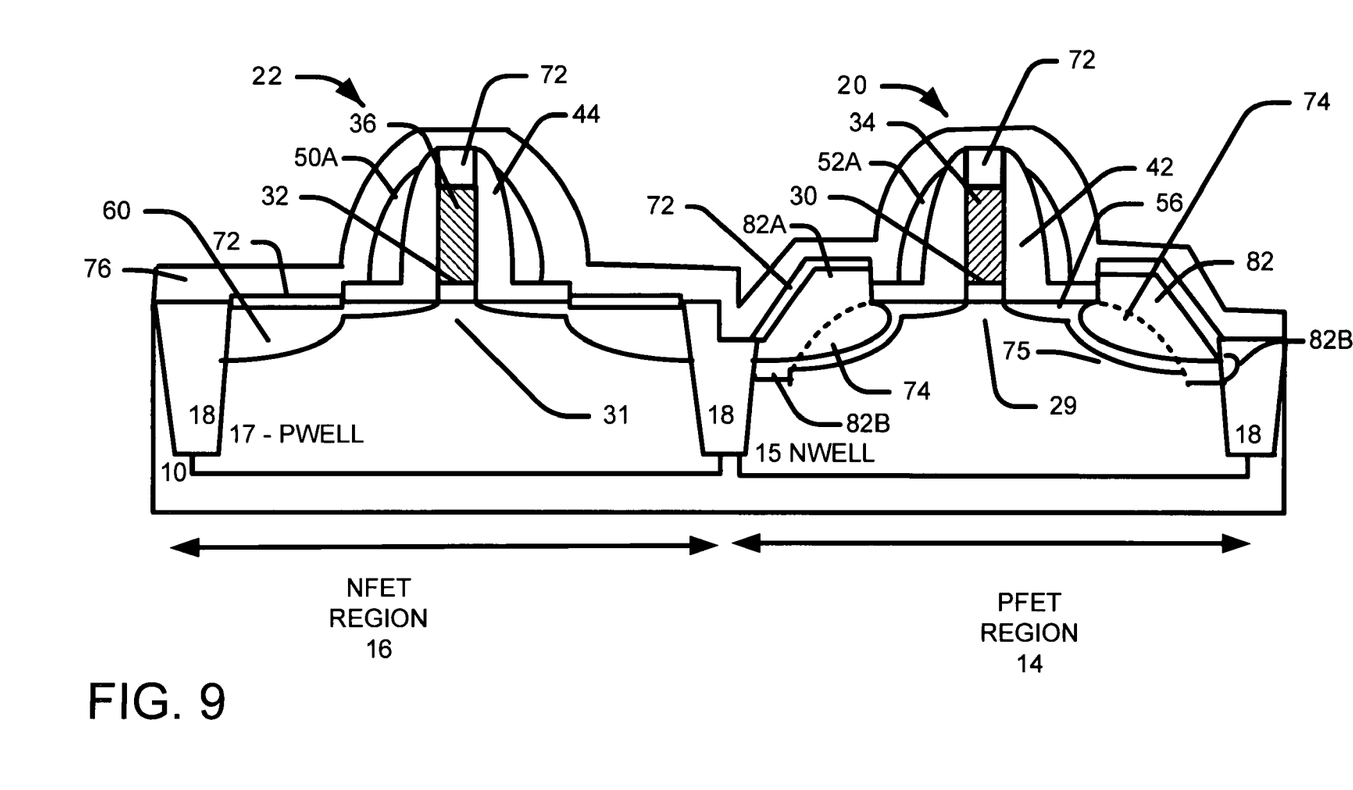

Referring to FIG. 9, we can form silicide regions 72 over the Source and drain regions and the gates.

K. Stress Liner

Referring to FIG. 9, we form a stress liner 76 over the substrate surface. The stress liner creates a compressive stress on the PFET channel 29. The reduced width PFET spacers on the PFET gate 34 increase the compressive stress to the channel.

An example of a stress liner process is as follows. We can deposit a SiN layer over the gate structures. This SiN layer is also used as a contact etch stop layer. To further enhance the device performance of the PFET, we can use a compressive stress liner with thickness of about 20 to 100 nm, with stress in the range of −1.5 GPa to −5 GPa.

L. Non-Limiting Example Embodiments

The example embodiments of the present invention show methods to fabricate PFETs using a novel embedded SiGe (eSiGe) process scheme that greatly enhances the PFET device performance. In an example embodiment, after in-situ boron doped eSiGe S/D stress is formed, the nitride cap over the poly-Si gate is removed. Thereafter, the PFET S/D (eSiGe) stressor region was subjected to an additional B implant to form a stressor wrap around doped region. Besides reducing the external resistance, the additional B implant also helps to tailor the junction profile below the SiGe active regions near the STI edge, thus improving P+ to Pwell (in adjacent NFET) isolation properties. Such an integration scheme greatly simplifies the eSiGe process flow, and is compatible with the stress liner overlying the transistor structures. The compressive stress from the stress liner can be efficiently transferred to the PFET channel due to the smaller final spacers formed.

The embodiments of the invention could be used in NFETs.

In the above example embodiments, example structures are shown but are not intended to limit the embodiments. For example, the gate structures are shown with first and second spacers, but can be formed with one or more than one spacers.

Similarly, the embodiment's reduced spacers, stress liners and shallow doped regions (e.g., stressor wrap around dope regions 82) can be used on NFET devices. The Stressor can be in the form of a material that is advantage to the NFET such as carbon doped silicon (SiC). The stress liners and stressor regions can be formed to apply the appropriate stress for NFET devices.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for forming semiconductor device comprising:
   providing a substrate prepared with a first active region having a first gate of a first transistor and separated by first isolation regions and a second active region having a second gate of a second transistor and separated by second isolation regions, wherein the gates comprises sidewall spacers on sidewalls of the gate;
   lining only the first active region with a liner layer;
   forming recesses in source/drain (S/D) regions adjacent to the sides of the second gate in the second active region unprotected by the liner;
   forming doped S/D stressors in the recesses, wherein the doped S/D stressors comprise dopants of a second polarity type; and
   implanting dopants of the second polarity type into the doped S/D stressors to form upper doped regions in the S/D stressors, the upper doped regions enhance the dopant concentration of the doped S/D stressors, wherein the upper doped regions comprise wrap around doped regions having first and second wrap around doped sub-regions, the first wrap around sub-regions being adjacent to the gate and the second wrap around doped sub-regions being adjacent to second isolation regions, wherein the first wrap around doped sub-regions are disposed within the doped S/D stressors and the second wrap around doped sub-regions extend below the doped S/D stressors, the upper doped regions reduce external resistance of the second transistor.

2. The method claimed 1 wherein forming the stressors comprises growing stressors in the recesses by epitaxial growth.

3. The method claim 1 wherein forming the stressors comprises growing stressors in the recesses by epitaxial growth, the stressors comprise first portions adjacent to the gate having planar surfaces and second portions adjacent to the isolation regions having slanted surfaces.

4. The method claim 1 wherein the stressors comprise SiGe stressors.

5. The method claim 1 wherein forming the stressors comprises growing stressors in the recesses having top surfaces above a surface of the substrate.

6. The method claim 1 wherein forming recesses comprises:
   masking the first active region; and
   isotropically etching the second active region selective to the isolation regions and the gate to form recess having an undercut below spacers on sidewalls of the second gate.

7. The method claim 1 wherein lining the first active region comprises lining the first active region with a dielectric liner.

8. The method claim 1 wherein lining the first active region comprises a low temperature oxidation process.

9. The method of claim 1 comprises recessing at least portions of the second isolation region adjacent to the second active region; wherein recessed portions have recessed top surfaces above bottoms of the stressors.

10. The method of claim 9 comprises forming a stress liner over the second active region covering the second transistor; wherein recessing the isolation regions enhances stress of the stress liner on a channel of the second transistor.

11. The method of claim 10 comprises reducing widths of second spacers on sidewalls of the second gate to enhance stress of the stress liner on the channel of the second transistor.

12. The method claim 1 comprises:
   reducing a width of the second spacers on sidewalls of the second gate; and
   forming a stress liner over the second active region covering the second transistor, wherein reducing the width enhances stress of the stress liner on a channel of the second transistor.

13. The method claim 1 wherein:
   the first active region comprises a n-type transistor and the second active region comprises a p-type transistor; and
   the stressors induce a compressive stress on a channel of the p-type transistor.

14. The method of claim 1 wherein forming the doped S/D stressors comprises insitu doped epitaxy.

15. The method of claim 1 wherein:
   forming the S/D stressors comprises growing stressors in the recesses by instu doped epitaxy, the stressors comprise first portions adjacent to the gate having planar surfaces and second portions adjacent to the isolation regions having slanted surfaces; and
   the upper wrap around doped regions wrap around the upper portion of the doped S/D stressors.

16. The method of claim 1 wherein the upper doped regions comprise a higher concentration of second polarity type dopants than other portions of the doped S/D stressors.

17. A method for forming semiconductor device comprising:
   providing a substrate prepared with a first active region separated by first isolation regions, the first active region includes a first gate of a first transistor, wherein the first gate comprises a gate dielectric over the substrate, a gate electrode over the gate dielectric and sidewall spacers on the first gate;
   forming recesses in S/D regions adjacent to sides of the first gate;
   forming doped S/D stressors in the recesses, wherein the doped S/D stressors comprise dopants of a first polarity type; and
   implanting dopants of the first polarity type into doped S/D stressors to form upper doped regions in the doped S/D stressors, wherein the upper doped regions comprise wrap around doped regions having
      first wrap around doped sub-regions, the first wrap around sub-regions being adjacent to the gate, wherein the first wrap around doped sub-region is disposed within the doped S/D stressors; and
      second wrap around doped regions, the second wrap around doped sub-regions being adjacent to second isolation regions, wherein the second wrap around doped sub-regions extend below the doped S/D stressors,
   wherein the wrap around doped regions reduce external resistance of the first transistor.

18. The method claim 17 wherein forming the stressors comprises growing stressors in the recesses by epitaxial growth, the stressors comprise first portions adjacent to the gate having planar surfaces and second portions adjacent to the isolation regions having slanted surfaces.

19. The method of claim 17 wherein forming the doped S/D stressors comprises insitu doped epitaxy.

20. The method of claim 17 wherein the doped S/D stressors comprises doped SiGe.

21. The method claim 17 wherein forming recesses comprises:
   masking the first active region; and
   isotropically etching the first active region selective to the isolation regions and the gate to form recess having an undercut below spacers on sidewalls of the first gate.

22. The method of claim 17 comprises recessing at least portions of the second isolation region adjacent to the second active region, wherein recessed portions have recessed top surfaces above bottoms of the stressors.

23. The method of claim 22 comprises forming a stress liner over the second active region covering the second transistor, wherein recessing the isolation regions enhances stress of the stress liner on a channel of the second transistor.

24. The method of claim 23 comprises reducing widths of second spacers on sidewalls of the second gate to enhance stress of the stress liner on the channel of the second transistor.

25. A method for forming semiconductor device comprising:
   providing a substrate prepared with a first active region separated by first isolation regions, the first active region having a first gate of a first transistor, wherein the first gate comprises a gate dielectric over the substrate, a gate electrode over the gate dielectric, a cap over the gate electrode and sidewall spacers on the gate;
   forming recesses in S/D regions adjacent to sides of the first gate;
   forming doped S/D stressors in the recesses, wherein the doped S/D stressors comprise dopants of a first polarity type;
   reducing a width of spaces;
   implanting dopants of the first polarity type into the S/D stressors to form upper doped regions in the doped S/D stressors, wherein the upper doped regions comprise wrap around doped regions having first and second wrap around doped sub-regions, the first wrap around sub-regions being adjacent to the gate and the second wrap around doped sub-regions being adjacent to second isolation regions, wherein the first wrap around doped sub-region is disposed within the doped S/D stressors and the second wrap around doped sub-regions extend below the doped S/D stressors, the wrap around doped regions reduce external resistance of the first transistor; and forming a stress liner over the first active region covering the first transistor, wherein reducing the width of the spacers enhances stress of the stress liner on a channel of the first transistor.

26. The method claim 25 wherein forming the stressors comprises growing stressors in the recesses by epitaxial growth, the stressors comprise first portions adjacent to the gate having planar surfaces and second portions adjacent to the isolation regions having slanted surfaces.

27. The method claim 25 wherein:
the first transistor comprises a p-type transistor; and
the stressors induce a compressive stress on a channel of the p-type transistor.

* * * * *